US 8,448,039 B2

(12) United States Patent
Gunnam

(10) Patent No.: US 8,448,039 B2
(45) Date of Patent: May 21, 2013

(54) ERROR-FLOOR MITIGATION OF LDPC CODES USING TARGETED BIT ADJUSTMENTS

(75) Inventor: Kiran Gunnam, San Jose, CA (US)

(73) Assignee: LSI Corporation, San Jose, CA (US)

(*) Notice: Subject to any disclaimer, the term of this patent is extended or adjusted under 35 U.S.C. 154(b) by 1073 days.

(21) Appl. No.: 12/401,116

(22) Filed: Mar. 10, 2009

(65) Prior Publication Data

US 2010/0042890 A1 Feb. 18, 2010

Related U.S. Application Data

(60) Provisional application No. 61/089,297, filed on Aug. 15, 2008.

(51) Int. Cl.
*H03M 13/00* (2006.01)
(52) U.S. Cl.
USPC .......................................................... 714/752
(58) Field of Classification Search
None
See application file for complete search history.

(56) References Cited

U.S. PATENT DOCUMENTS

| 3,755,779 | A | 8/1973 | Price |
| 4,295,218 | A | 10/1981 | Tanner |
| 5,048,060 | A | 9/1991 | Arai et al. |
| 5,721,745 | A | 2/1998 | Hladik et al. |
| 5,734,962 | A | 3/1998 | Hladik et al. |
| 6,023,783 | A | 2/2000 | Divsalar et al. |
| 6,236,686 | B1 | 5/2001 | Kamishima |
| 6,307,901 | B1 | 10/2001 | Yu et al. |
| 6,550,023 | B1 | 4/2003 | Brauch et al. |
| 6,678,843 | B2 | 1/2004 | Giulietti et al. |
| 6,745,157 | B1 | 6/2004 | Weiss et al. |
| 6,760,879 | B2 | 7/2004 | Giese et al. |
| 6,888,897 | B1 | 5/2005 | Nazari et al. |
| 6,910,000 | B1 | 6/2005 | Yedidia et al. |

(Continued)

FOREIGN PATENT DOCUMENTS

| WO | WO03092170 A1 | 11/2003 |
| WO | WO2004079563 A1 | 9/2004 |

(Continued)

OTHER PUBLICATIONS

Han et al., "Low-Floor Decoders for LDPC Codes", Sep. 26-28, 2007, Forth-Fifth Annual Allterton Conference, pp. 473-479.*

(Continued)

*Primary Examiner* — Gabriel Chu
(74) *Attorney, Agent, or Firm* — Mendelsohn, Drucker & Associates, P.C.; Craig M. Brown; Steve Mendelsohn

(57) ABSTRACT

Embodiments of the present invention are methods for breaking one or more trapping sets in a near codeword of a failed graph-based decoder, e.g., an LDPC decoder. The methods determine, from among all bit nodes associated with one or more unsatisfied check nodes in the near codeword, which bit nodes, i.e., the suspicious bit nodes or SBNs, are most likely to be erroneous bit nodes. The methods then perform a trial in which the values of one or more SBNs are altered and decoding is re-performed. If the trial does not converge on the decoded correct codeword (DCCW), then other trials are performed until either (i) the decoder converges on the DCCW or (ii) all permitted combinations of SBNs are exhausted. The starting state of a particular trial, and the set of SBNs available to that trial may change depending on the results of previous trials.

38 Claims, 9 Drawing Sheets

U.S. PATENT DOCUMENTS

| | | |
|---|---|---|
| 7,143,333 B2 | 11/2006 | Blankenship et al. |
| 7,181,676 B2 | 2/2007 | Hocevar |
| 7,219,288 B2 | 5/2007 | Dielissen et al. |
| 7,237,181 B2 | 6/2007 | Richardson |
| 7,296,216 B2 | 11/2007 | Shen et al. |
| 7,340,671 B2 | 3/2008 | Jones et al. |
| 7,353,444 B2 | 4/2008 | Owsley et al. |
| 7,457,367 B2 | 11/2008 | Farhang-Boroujeny et al. |
| 7,689,888 B2 | 3/2010 | Kan et al. |
| 7,725,800 B2 | 5/2010 | Yang et al. |
| 7,730,377 B2 | 6/2010 | Hocevar |
| 7,739,558 B1 | 6/2010 | Farjadrad et al. |
| 7,752,523 B1 | 7/2010 | Chaichanavong et al. |
| 7,805,642 B1 | 9/2010 | Farjadrad |
| 7,895,500 B2 | 2/2011 | Sun et al. |
| 7,904,793 B2 | 3/2011 | Mokhlesi et al. |
| 7,941,737 B2 | 5/2011 | Gopalakrishnan et al. |
| 7,949,927 B2 | 5/2011 | Park et al. |
| 8,010,869 B2 | 8/2011 | Wejn et al. |
| 8,020,070 B2 | 9/2011 | Langner et al. |
| 8,037,394 B2 | 10/2011 | Djurdjevic et al. |
| 8,046,658 B2 | 10/2011 | Heinrich et al. |
| 8,051,363 B1 | 11/2011 | Liu |
| 8,103,931 B2 | 1/2012 | Wang et al. |
| 8,127,209 B1 | 2/2012 | Zhang et al. |
| 8,151,171 B2 | 4/2012 | Blanksby |
| 8,156,409 B2 | 4/2012 | Patapoutian et al. |
| 8,171,367 B2 | 5/2012 | Gao et al. |
| 8,205,134 B2 | 6/2012 | Harrison et al. |
| 8,205,144 B1 | 6/2012 | Yadav |
| 8,214,719 B1 | 7/2012 | Sheng et al. |
| 8,219,878 B1 | 7/2012 | Varnica et al. |
| 8,255,763 B1 | 8/2012 | Yang et al. |
| 8,301,984 B1 | 10/2012 | Zhang et al. |
| 2002/0062468 A1 | 5/2002 | Nagase et al. |
| 2002/0166095 A1 | 11/2002 | Lavi et al. |
| 2005/0193320 A1* | 9/2005 | Varnica et al. ............ 714/800 |
| 2005/0204255 A1 | 9/2005 | Yeh et al. |
| 2005/0283707 A1 | 12/2005 | Sharon et al. |
| 2006/0013306 A1 | 1/2006 | Kim et al. |
| 2006/0036928 A1 | 2/2006 | Eroz et al. |
| 2006/0107181 A1 | 5/2006 | Dave et al. |
| 2006/0115802 A1 | 6/2006 | Reynolds |
| 2006/0285852 A1 | 12/2006 | Xi et al. |
| 2007/0011569 A1 | 1/2007 | Vila Casado et al. |
| 2007/0011573 A1 | 1/2007 | Farjadrad et al. |
| 2007/0011586 A1 | 1/2007 | Belogolovyi et al. |
| 2007/0044006 A1 | 2/2007 | Yang et al. |
| 2007/0071009 A1 | 3/2007 | Nagaraj et al. |
| 2007/0089018 A1 | 4/2007 | Tang et al. |
| 2007/0089019 A1 | 4/2007 | Tang et al. |
| 2007/0124652 A1 | 5/2007 | Litsyn et al. |
| 2007/0147481 A1 | 6/2007 | Bottomley et al. |
| 2007/0153943 A1 | 7/2007 | Nissila |
| 2007/0162788 A1 | 7/2007 | Moelker |
| 2007/0220408 A1 | 9/2007 | Huggett et al. |
| 2007/0234178 A1 | 10/2007 | Richardson et al. |
| 2007/0234184 A1 | 10/2007 | Richardson |
| 2008/0049869 A1 | 2/2008 | Heinrich et al. |
| 2008/0082868 A1 | 4/2008 | Tran et al. |
| 2008/0104485 A1 | 5/2008 | Lyakh et al. |
| 2008/0109701 A1 | 5/2008 | Yu et al. |
| 2008/0126910 A1 | 5/2008 | Venkatesan et al. |
| 2008/0148129 A1 | 6/2008 | Moon |
| 2008/0163032 A1 | 7/2008 | Lastras-Montano |
| 2008/0235561 A1 | 9/2008 | Yang |
| 2008/0276156 A1 | 11/2008 | Gunnam et al. |
| 2008/0301517 A1 | 12/2008 | Zhong |
| 2008/0301521 A1 | 12/2008 | Gunnam et al. |
| 2009/0063931 A1 | 3/2009 | Rovini et al. |
| 2009/0083609 A1 | 3/2009 | Yue et al. |
| 2009/0132897 A1 | 5/2009 | Xu et al. |
| 2009/0150745 A1* | 6/2009 | Langner et al. ............ 714/752 |
| 2009/0235146 A1 | 9/2009 | Tan et al. |
| 2009/0259912 A1 | 10/2009 | Djordjevic et al. |
| 2009/0273492 A1 | 11/2009 | Yang et al. |
| 2009/0307566 A1 | 12/2009 | No et al. |
| 2009/0319860 A1* | 12/2009 | Sharon et al. ............ 714/752 |
| 2010/0037121 A1 | 2/2010 | Jin et al. |
| 2010/0042806 A1 | 2/2010 | Gunnam |
| 2010/0042890 A1 | 2/2010 | Gunnam |
| 2010/0050043 A1 | 2/2010 | Savin |
| 2010/0058152 A1 | 3/2010 | Harada |
| 2010/0088575 A1 | 4/2010 | Sharon et al. |
| 2010/0192043 A1 | 7/2010 | Alrod et al. |
| 2012/0135285 A1 | 5/2012 | Iwama et al. |
| 2012/0139074 A1 | 6/2012 | Abe |

FOREIGN PATENT DOCUMENTS

| | | |
|---|---|---|
| WO | WO2007114724 A1 | 10/2007 |
| WO | WO2008004215 A2 | 1/2008 |
| WO | WO 2010/019168 A1 | 2/2010 |

OTHER PUBLICATIONS

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF(q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Sripimanwat, K., "Turbo Code Applications: A Journey From a Paper to Realization", Oct. 26, 2005, Springer, p. 27.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Communications, Communications and Mobile Computing, 2005, pp. 630-635, vol. 1.

Hao Zhong,Tong Zhang—"Block-LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001, pp. 638-656, vol. 47, No. 2.

Tom Richardson—"Error Floors of LDPC Codes", IEEE Transactions on Information Theory, Feb. 2001, pp. 1426-1435, vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005, pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007, 6th International Conference on Embedded Systems, Jan. 2007 pp. 738-743.

David J.C. MacKay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr.—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics", Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,pp. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299, vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002. pp. 404-412, vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981, pp. 533-547, vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698, vol. 41, No. 3.

Badri N. Vellambi R, and Faramarz Fekri, "An Improved Decoding Algorithm for Low-Density Parity-Check Codes over the Binary Erasure Channel", IEEE Globecom 2005 proceedings, pp. 1182-1186.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.

Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.

C. A. Cole, S. G. Wilson, E. K. Hall and T. R. Giallorenzi, "A General Method for Finding Low Error Rates of LDPC Codes," http://arxiv.org/abs/cs.IT/0605051.

D. MacKay and M. Postol, "Weaknesses of margulis and ramanujan-margulis low-density parity-check codes," Electronic Notes in Theoretical Computer Science, vol. 74, 2003.

B. Xia and W. E. Ryan, "On importance sampling for linear block codes," Proc. 2003 IEEE International Conference on Communications, vol. 4, pp. 2904-2908, May 2003.

L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.

* cited by examiner

ERROR-FLOOR MITIGATION OF LDPC CODES USING TARGETED BIT ADJUSTMENTS

CROSS-REFERENCE TO RELATED APPLICATIONS

This application claims the benefit of the filing date of U.S. provisional application No. 61/089,297, filed on Aug. 15, 2008, the teachings of which are incorporated herein by reference in their entirety.

The subject matter of this application is related to (1) the subject matter of PCT application no. PCT/US08/86523 filed on Dec. 12, 2008 and (2) the subject matter of PCT application no. PCT/US08/86537 filed on Dec. 12, 2008, the teachings of both of which are incorporated herein by reference in their entirety.

BACKGROUND OF THE INVENTION

1. Field of the Invention

The invention relates to digital signal processing, and, in particular, to a data-encoding method known as low-density parity check (LDPC) coding.

2. Description of the Related Art

Communication is the transmission of information by a transmitter to a receiver over a communications channel. In the real world, the communications channel is a noisy channel, outputting to the receiver a distorted version of the information received from the transmitter. A hard disk (HD) drive is one such noisy channel, accepting information from a transmitter, storing that information, and then, possibly, transmitting a more or less distorted copy of that information to a receiver.

The distortion introduced by a communications channel such as an HD drive might be great enough to cause a channel error, i.e., where the receiver interprets the channel output signal as a 1 when the channel input signal was a 0, and vice versa. Channel errors reduce throughput, and are thus undesirable. Hence, there is an ongoing need for tools which detect and/or correct channel errors. Low-density parity check (LDPC) coding is one method for the detection and correction of channel errors.

LDPC codes are among the known near-Shannon-limit codes that can achieve very low bit-error rates (BER) for low signal-to-noise ratio (SNR) applications. LDPC decoding is distinguished by its potential for parallelization, low implementation complexity, low decoding latency, as well as less-severe error-floors at high SNRs. LDPC codes are considered for virtually all the next-generation communication standards.

SUMMARY OF THE INVENTION

In one embodiment, the present invention is a method for decoding encoded data using bit nodes and check nodes. The method performs iterative decoding on the encoded data to generate an original near codeword (NCW) having one or more unsatisfied check nodes (USCs), each USC having one or more associated bit nodes (ABNs), the one or more ABNs for the one or more USCs forming a set of ABNs. Next, the method selects, from the set of ABNs, a first set of suspicious bit nodes (SBNs) that may be erroneous bit nodes for the original NCW. Then, the method adjusts at least one of the SBNs in the first set to generate a modified NCW, and performs iterative decoding on the modified NCW to attempt to generate a decoded correct codeword (DCCW) for the encoded data.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

DETAILED DESCRIPTION

Figure 1:
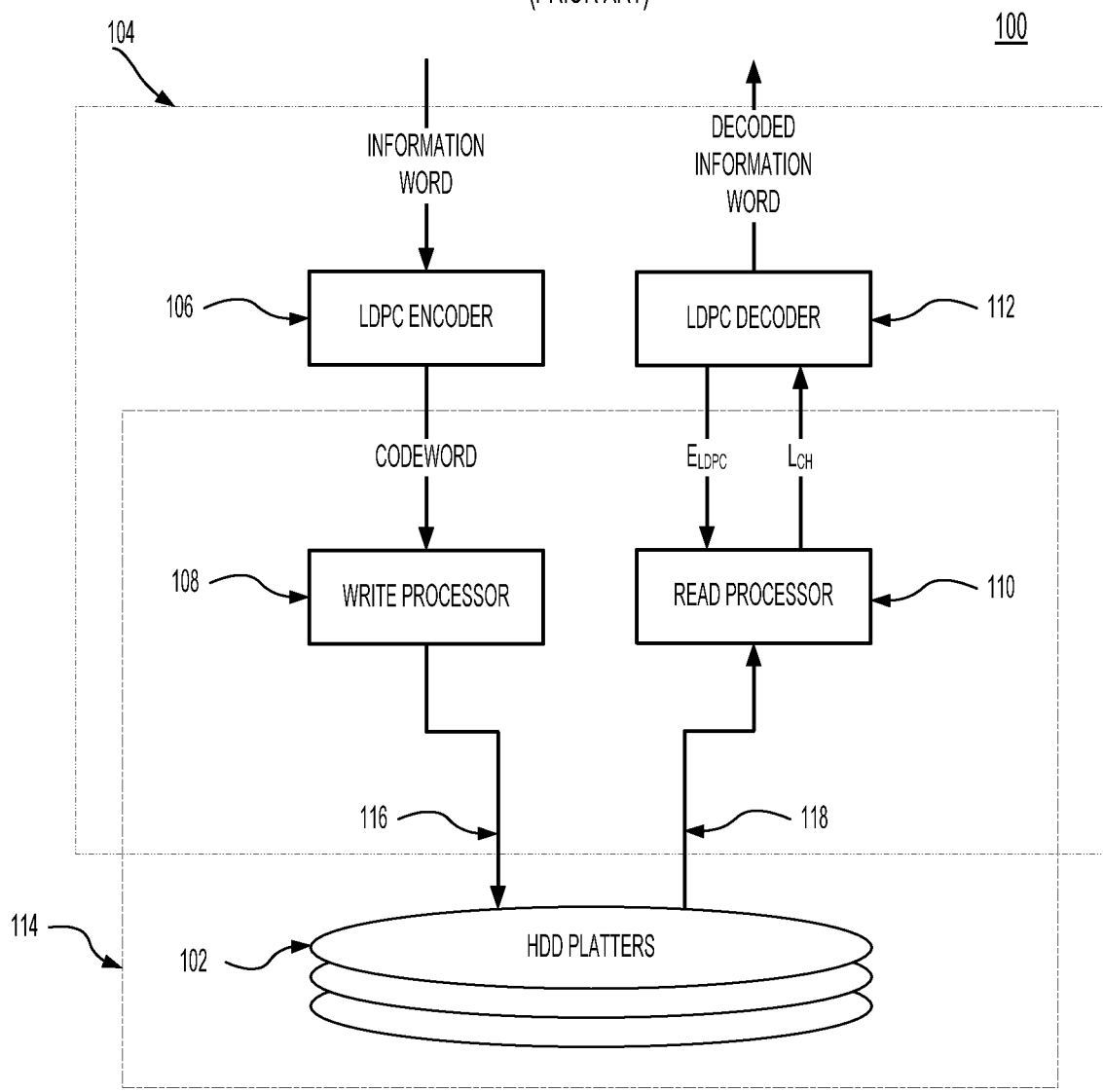
FIG. 1 is a block diagram of a typical hard disk (HD) drive 100.

FIG. 1 is a block diagram of a portion of a typical hard disk (HD) drive 100 that utilizes LDPC coding. HD drive 100 comprises platters 102 and read channel 104. Read channel 104 comprises LDPC encoder 106, write processor 108, read processor 110, and LDPC decoder 112. Path 114 is the noisy channel between LDPC encoder 106 and LDPC decoder 112.

Information words to be written to platters 102 are processed by LDPC encoder 106 to yield LDPC codewords. LDPC codewords are sent to write processor 108, which comprises a number of modules, e.g., a BPSK (binary phase-shift keying) encoder, a digital-to-analog converter, etc. Output 116 of write processor 108 is written to platters 102.

Signals 118 read from platters 102 are sent to read processor 110, which comprises a number of modules, e.g., a pre-amplifier, a continuous-time filter, a fixed-impulse response filter, a detector, an analog-to-digital converter, etc. Read processor 110 outputs log-likelihood ratio (LLR) values $L_{ch}$ to LDPC decoder 112, which in turn outputs decoded information words. Additionally, LDPC decoder 112 sends $E_{LDPC}$ values back to read processor 110. $E_{LDPC}$ are defined in Equation 6 below, and represent intermediate calculated LLR values. Read processor 110 uses the $E_{LDPC}$ values to tune its performance, a process known as turbo-equalization.

LDPC Encoding

LDPC encoder 106 appends to the bits of an information word a number of parity bits specified by the LDPC code, to yield a codeword. The bits in an information word are known as variable bits, and the number of those variable bits is denoted K. The total number of bits in an LDPC codeword is denoted N. Thus, the number of parity bits is given by N−K. The rate of a particular LDPC code is K/N, i.e., the ratio of the information word length to the codeword length. Thus, an LDPC code which appends six parity bits to each three-bit information word to yield a nine-bit codeword has a rate of ⅓. In the case of a typical HD drive, the information word length K is 4096 bits (the length of a typical HD drive sector), and the number of parity bits is approximately 410 bits, for a codeword length of 4506 bits and a rate of 0.9.

Each parity bit in an LDPC codeword is associated with one or more other (variable or parity) bits in that codeword in a particular way as specified by the particular LDPC code, and the value assigned to a parity bit is set so as to satisfy the LDPC code. Typical LDPC codes specify that associated bits satisfy a parity check constraint, e.g., the sum of the associated bits is an even number, i.e., sum modulo 2=0.

The LDPC Code

A particular LDPC code is defined by a two-dimensional matrix of 1s and 0s known as the parity check matrix, or H matrix, or simply H. H is known, a priori, by both the LDPC encoder and decoder. H comprises N columns and N−K rows, i.e., a column for every bit of the codeword, and a row for every parity bit. Each 1 in H represents an association between the codeword bit of the column and the parity bit of the row. For example, a 1 at the third row, seventh column of H means that the third parity check bit is associated with the seventh bit of the codeword. The modulo 2 sum of the value of a check bit and all variable bits associated with that check bit should be 0.

The number of 1s in a column of H is known as the weight $w_c$ of that column. Similarly, the number of 1s in a row of H is known as the weight $w_r$ of that row. The LDPC code defined by an H wherein all columns have the same $w_c$ and all rows have the same $w_r$ is known as a regular LDPC code. An LDPC code defined by an H where $w_c$ and/or $w_r$ are not the same across all columns and/or rows, respectively, is known as an irregular LDPC code.

A defining characteristic of typical LDPC codes is that H is "sparse," i.e., the elements of H are mostly 0s with few 1s. Research has shown that H matrices typically need $w_c \geq 3$ in order to perform well, and that irregular LDPC codes outperform regular LDPC codes.

Figure 2:
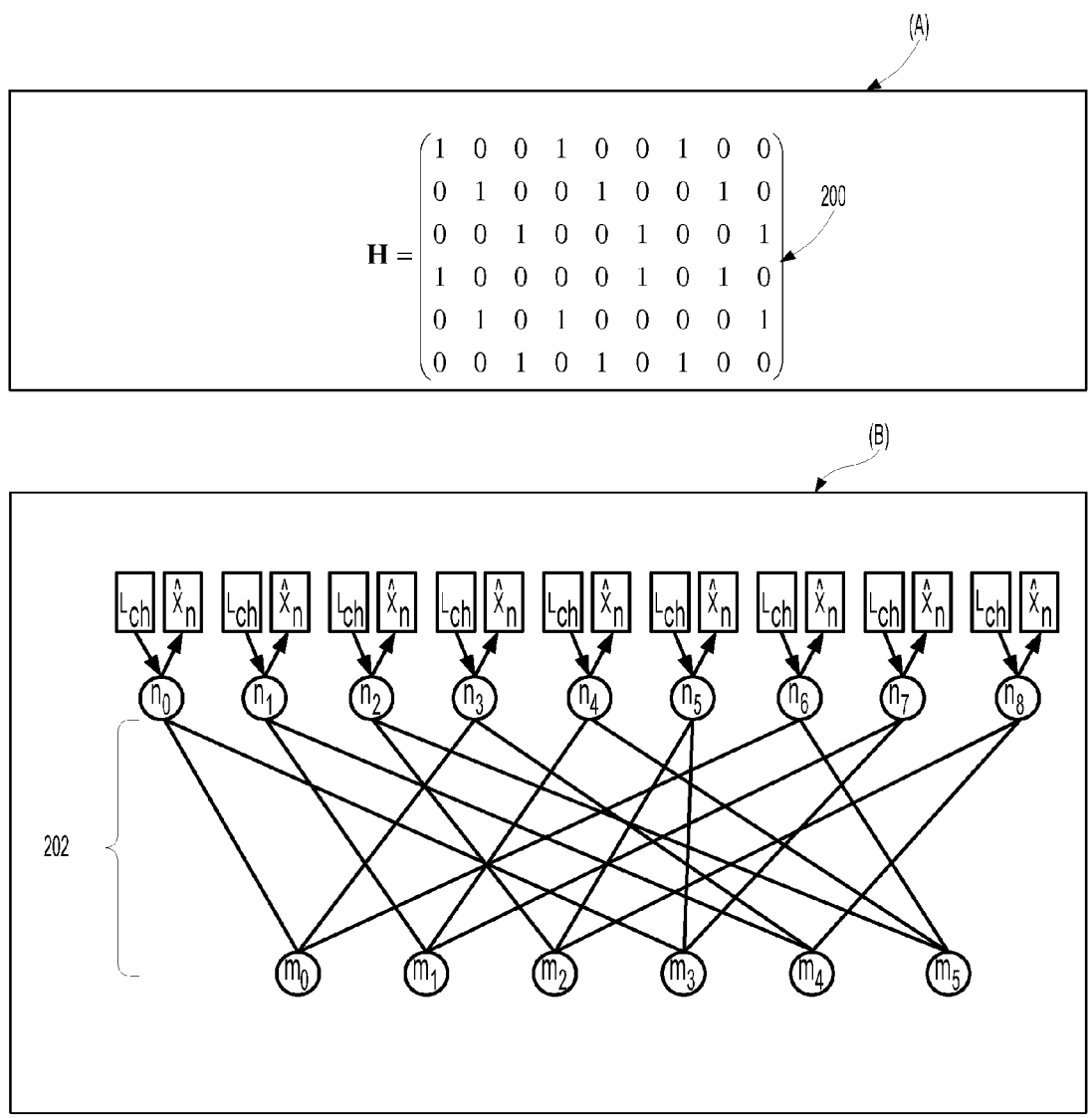
FIG. 2(A) depicts LDPC H matrix 200.
FIG. 2(B) is a Tanner graph of H matrix 200.

FIG. 2(A) depicts LDPC H matrix 200. H matrix 200 comprises N=9 columns and N−K=6 rows. Thus, H matrix 200 defines an LDPC code which accepts a three-bit information word, appends six parity bits, and outputs a nine-bit codeword. Thus, the rate of this particular LDPC code is 3/9 or 1/3. The LDPC code defined by H matrix 200 is regular, with a $w_c$ of two, and a $w_r$ of three.

Channel Output: Log-Likelihood Ratios

Returning to FIG. 1, the path 114 between LDPC encoder 106 and LDPC decoder 112 is a noisy channel, and, as such, decoder 112 does not receive a perfect copy of the codewords outputted by LDPC encoder 106. Instead, read processor 110 outputs one or more $L_{ch}$ values, where each $L_{ch}$ value corresponds to a bit in the channel input codeword.

Each $L_{ch}$ value is a log-likelihood ratio (LLR). An LLR is a data structure comprising a number of bits, where a single sign bit indicates the hard decision (i.e., read processor 110's best guess as to whether the original bit was a 1 or a 0), and the remaining magnitude bits indicate read processor 110's degree of confidence in that hard decision. More precisely, the LLR represents $$\log \frac{p_0}{p_1},$$

where $p_0$ is the probability that the sample represents a 0, and $p_1$ is the probability that the sample represents a 1.

For example, read processor 110 might output each $L_{ch}$ value as a five-bit data structure, where the most-significant bit is a sign bit which indicates the hard-decision value, and the 16 values of the four magnitude bits indicate the confidence of the hard decision. Thus, for example, in one typical scheme, an LLR value of binary 00000 would indicate a hard-decision value of 0 with least confidence, a value of binary 01111 would indicate a hard-decision value of 0 with maximum confidence, binary 10000 would be unused, binary 10001 would indicate a hard-decision value of 1 with least confidence, and a value of binary 11111 would indicate a hard-decision value of 1 with maximum confidence.

LDPC Decoding: Belief Propagation

Figure 3:
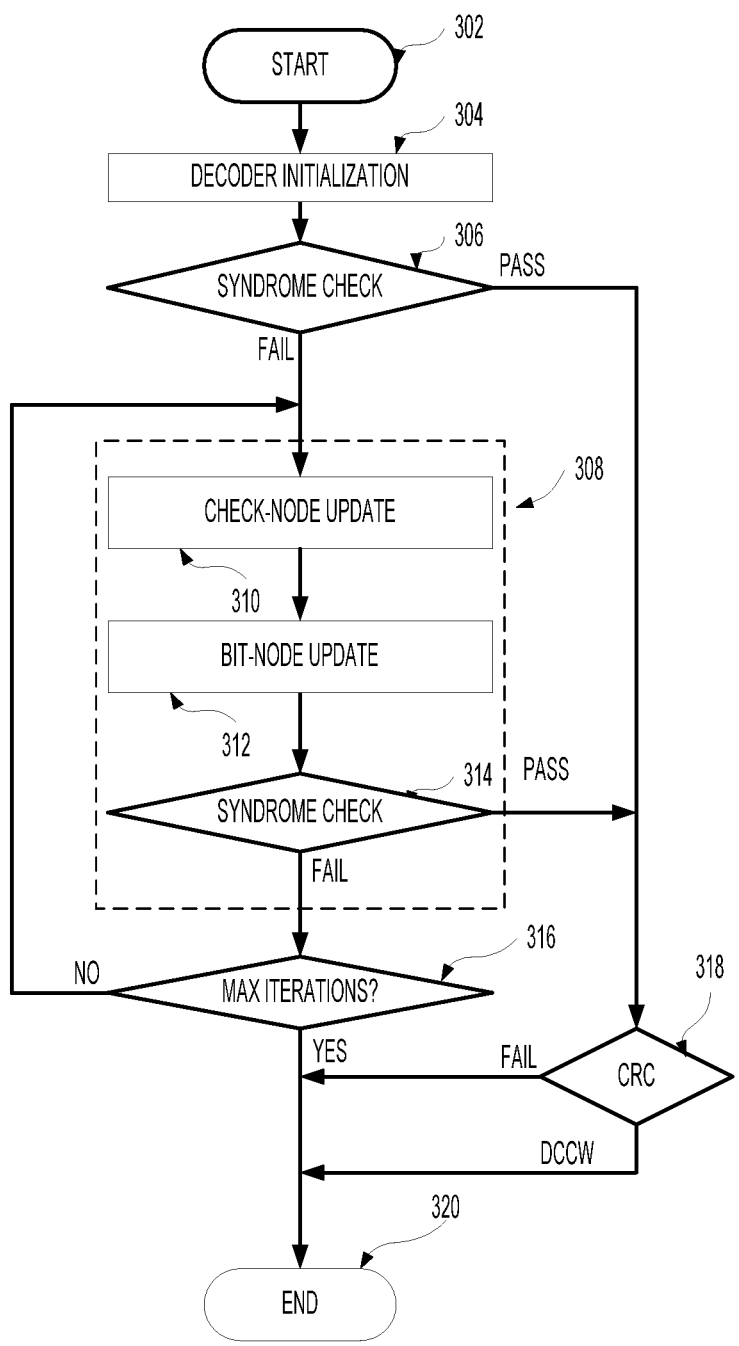
FIG. 3 is a flowchart of typical LDPC decoding method 300 used by decoder 112.

FIG. 3 is a flowchart of typical LDPC decoding method 300 used by decoder 112. LDPC decoder 112 receives N number of $L_{ch}$ values and outputs decoded information word. The heart of decoding method 300 is an iterative, two-phase message-passing algorithm called belief propagation. Belief propagation is best explained with the use of a visualization called a Tanner graph.

FIG. 2(B) is a Tanner graph of H matrix 200. In general, a Tanner graph comprises 1) a number of bit nodes n equal to the number of columns in H (and thus equal to the number of variable bits), 2) a number of check nodes m equal to the number of rows in H (and thus equal to number of parity bits), 3) lines, also known as edges, each of which connects a single bit node to a single check node, 4) for each bit node n, the original $L_{ch}$ value received from a receiver, and 5) for each bit node n, a calculated hard-decision output value $\hat{x}_n$. Tanner graph 2(B) comprises nine bit nodes $n_0$-$n_8$, six check nodes $m_0$-$m_5$, 18 edges 202 connecting bit nodes to check nodes, nine $L_{ch}$ values, and nine $\hat{x}_n$ values.

The edges in a Tanner graph represent the relationships between (i.e., variable) bit nodes n and check nodes m, i.e., edges represent 1s in H. For example, in FIG. 2(B), an edge 202 connects first bit node $n_0$ to fourth check node $m_3$, meaning that there is a 1 in the first column, fourth row of H matrix 200 in FIG. 2(A).

A Tanner graph is a bipartite graph, i.e., an edge can connect a bit node to only a check node, and cannot connect a bit node to another bit node, or a check node to another check node. The set of all bit nodes n connected by edges to a particular check node m is denoted N(m). The set of all check nodes m connected by edges to a particular bit node n is denoted M(n).

The index of a particular (bit or check) node is its ordinal sequence in the graph. The degree of a (bit or check) node is the number of edges connected to that node. Thus, the degree of bit node n in a Tanner graph is equal to the weight $w_c$ of column n in the corresponding H matrix, and the degree of check node m in a Tanner graph is equal to the weight $w_r$ of row m in the corresponding H matrix.

Returning to FIG. 3, processing starts at step 302 and proceeds to step 304, decoder initialization. Decoder initialization 304 comprises setting all edges (e.g., 202 of FIG. 2(B)) connected to bit node n to the corresponding $L_{ch}$ value associated with bit node n, and setting the $\hat{x}_n$ value of bit node n to the hard-decision value of bit node n's $L_{ch}$. Thus, for example, in FIG. 2(B), if the $L_{ch}$ value associated with bit node $n_0$ is +5, then, at step 304, the two edges 202 connecting bit node $n_0$ to check nodes $m_0$ and $m_3$ are set to +5, and bit node n's $\hat{x}_n$ value is set to 1. An alternative way of expressing the first part of this step is that bit node $n_0$ sends a message of +5 to each check node m in set M($n_0$). A message sent from a bit node n to a check node m is denoted $Q_{nm}$.

Step 304 then sends to syndrome check step 306 a vector $\hat{x}$ comprising N $\hat{x}_n$ values. Vector $\hat{x}$ is a codeword candidate. Syndrome check step 306 calculates syndrome vector z using the following Equation 1:

$$z = \hat{x} H^T \qquad (1)$$

where $H^T$ is the transpose of the H matrix. If z is a 0 vector, then vector $\hat{x}$ has satisfied all the parity check constraints defined by H, i.e., $\hat{x}$ is a valid codeword. In that case, processing proceeds to cyclic-redundancy check (CRC) check 318.

If, instead, z is not a 0 vector, then vector $\hat{x}$ fails one or more of the parity check constraints, which are typically referred to as unsatisfied check nodes or USCs. The number of elements in syndrome vector z that are not 0 scalar values is the number b of USCs in vector $\hat{x}$. Further, the indices of the non-zero scalar elements of syndrome vector z are the indices of the USCs in vector $\hat{x}$.

If vector $\hat{x}$ fails syndrome check 306, then processing continues to the first of one or more decoding iterations 308. Decoding iteration 308 comprises three steps: 1) a belief-propagation check-node update step 310, 2) a belief-propagation bit-node update step 312, and 3) a syndrome check step 314, which is identical to step 306.

In belief-propagation check-node update step 310, each check node m uses the $Q_{nm}$ messages received from all bit nodes n in set N(m) to calculate messages, denoted $R_{mn}$, according to the following Equations 2, 3, and 4:

$$R_{mn}^{(i)} = \delta_{mn}^{(i)} \max(\kappa_{mn}^{(i)} - \beta, 0) \quad (2)$$

$$\kappa_{mn}^{(i)} = |R_{mn}^{(i)}| = \min_{n' \in N(m)\backslash n} |Q_{n'm}^{(i-1)}| \quad (3)$$

$$\delta_{mn}^{(i)} = \left( \prod_{n' \in N(m)\backslash n} \mathrm{sgn}(Q_{n'm}^{(i-1)}) \right) \quad (4)$$

where i is the decoding iteration, N(m)\n is set N(m) excluding bit node n, and $\beta$ is a positive constant, the value of which depends on the code parameters. The calculated $R_{mn}$ are then sent back along those same edges to all bit nodes n in set N(m).

Next, in belief-propagation bit-node update step 312, each bit node n calculates $Q_{nm}$ messages according to the following Equation 5:

$$Q_{nm}^{(i)} = L_n^{(0)} + \sum_{m' \in M(n)\backslash m} R_{m'n}^{(i)} \quad (5)$$

where $L_n^{(0)}$ the $L_{ch}$ value for bit node n, and M(n)\m is set M(n) excluding check node m. Bit node n then sends the calculated $Q_{nm}$ messages to all check nodes m in set M(n).

Also during bit-node update step 312, each bit node n updates its $\hat{x}_n$ value according to the following Equations 6 and 7:

$$E_n^{(i)} = \sum_{m' \in M(n)} R_{mn}^{(i)} \quad (6)$$

$$P_n = L_n^{(0)} + E_n^{(i)} \quad (7)$$

If $P_n \geq 0$, then $\hat{x}_n = 0$, and if $P_n < 0$, then $\hat{x}_n = 1$. The values generated by Equation 6 are also referred to as E values or $E_{LDPC}$. Typically, $E_{LDPC}$ values are sent back to the read processor (e.g., 110 of FIG. 1) as part of a tuning process known as turbo-equalization. The specific belief-propagation algorithm represented by Equations 2-6 is known as the min-sum algorithm.

Note that $\hat{x}_n$ is updated during each decoding iteration 308 and finally outputted by decoding process 300. The original LLR values $L_{ch}$ remain unchanged during decoding process 300. In other words, during each decoding iteration 308, each bit node n casts its vote as to the proper value of all the other bit nodes n to which it is associated via a check node m. For example, in FIG. 2(B), bit node $n_0$ is associated with check nodes $m_0$ and $m_3$. Therefore, $n_0$ will cast its vote as to the proper values of the bit nodes associated with check nodes $m_0$ and $m_3$, i.e., $n_3$, $n_5$, $n_6$, and $n_7$. The greater the magnitude value of bit node n's $L_{ch}$ value (i.e., the greater the confidence), the more bit node n's vote counts. The net effect of this vote-casting is that the $\hat{x}_n$ value of a bit node with a low $L_{ch}$ magnitude value (i.e., confidence) will change and conform to the beliefs of the high-confidence bit nodes with which that bit node is associated. In other word, if a bit node's $L_{ch}$ value contains an erroneous hard-decision value and low magnitude, then the combined votes of the other bit nodes will tend, after one or more iterations, to correct that erroneous hard-decision value.

There are two types of LDPC decoding: non-layered and layered. In a non-layered decoder (e.g., 300 of FIG. 3), check-node updates (e.g. 310 of FIG. 3) for all check nodes in the codeword are performed serially, and then bit-node updates (e.g. 312 of FIG. 3) for all bit nodes in the codeword are performed serially, or vice versa.

In layered decoding, the check-node/bit-node update cycle is performed on subgraphs of H known as layers. A layer is a set of check nodes, i.e., rows of H, which have no bit nodes in common. H matrix 200 in FIG. 2(A) is constructed such that the first three check nodes (i.e., the first three rows) do not update common bit nodes, and thus form a first layer. The fourth, fifth, and sixth check nodes (i.e., the fourth, fifth, and sixth rows) are similarly constructed and thus form a second layer. Thus, one iteration of layered decoding of H matrix AA would involve (i) performing the check-node updates for all check nodes in layer 1, (ii) performing bit-node updates of all bit nodes in layer 1, (iii) performing check-nodes updates for all check nodes in layer 2, and (iv) performing bit-node updates of all bit nodes in layer 2. The combination of steps (i) and (ii) and the combination of steps (iii) and (iv) are known as sub-iterations.

Bit-node update step 312 sends to syndrome check step 314 a vector $\hat{x}$ constructed out of the current $\hat{x}_n$ values of the decoder. The syndrome check of step 314 is identical to the syndrome check of step 306 discussed above. If vector $\hat{x}$ passes syndrome check 314, then vector $\hat{x}$ is sent to CRC step 318.

LDPC Decoding: Cyclic Redundancy Check and Mis-Satisfied Check Nodes

Passing syndrome check 306 or 314 means only that vector $\hat{x}$ is a valid codeword, but not necessarily the decoded correct codeword (DCCW). It is possible for an LDPC decoder to generate a valid codeword which is not the DCCW. In that case, there are no USCs in vector $\hat{x}$, but there are mis-satisfied check nodes (MSCs). Thus, to ensure that valid vector $\hat{x}$ is the DCCW, process 300 passes vector $\hat{x}$ to cyclic redundancy check (CRC) 318. A CRC check is a checksum operation which can detect alteration of data during transmission or storage.

If vector $\hat{x}$ passes the CRC check, then vector $\hat{x}$ is the DCCW, and process 300 sets global variable DCCW to true, outputs vector $\hat{x}$, and terminates at step 320. Otherwise, vector $\hat{x}$ is not the DCCW, and process 300 sets global variable DCCW to false, outputs vector $\hat{x}$, and terminates at step 320. Global variable DCCW informs other decoding processes whether or not the DCCW has been generated.

Returning to step 314, if vector x̂ fails the syndrome check, then vector x̂ still contains one or more USCs. The typical method for resolving USCs is to perform another decoding iteration 308. However, there might exist one or more USCs in a particular vector x̂ which will never be satisfied in a reasonable amount of time. Thus, LDPC decoders are typically limited in how many decoding iterations they can perform on a particular vector x̂. Typical values for the maximum number of iterations range from 50 to 200.

In FIG. 3, step 316 determines whether the maximum number of iterations has been reached. If not, then another decoding iteration 308 is performed. If, instead, the maximum number of iterations has been reached, then decoder process 300 has failed. In that case, process 300 sets global variable DCCW to false, outputs vector x̂, and terminates at step 320.

A complete execution of process 300 is known as a decoding session.

BER, SNR, and Error Floors

The bit-error rate (BER) of an LDPC decoder is a ratio which expresses how many erroneously decoded bits will be generated for x number of bits processed. Thus, for example, a decoder with a BER of $10^{-9}$ will, on average, generate one erroneous bit for every billion bits processed. The smaller the BER, the better the decoder. The BER of an LDPC decoder increases (worsens) when the decoder fails, i.e., terminates without converging on the decoded correct codeword DCCW.

The BER of an LDPC decoder is strongly influenced by the signal-to-noise ratio (SNR) of the decoder's input signal. A graph of BER as a function of SNR typically comprises two distinct regions: an initial "waterfall" region where the BER improves (decreases) rapidly given a unit increase in SNR, and a subsequent "error floor" region where unit increases in SNR yield only modest improvements in BER. Thus, achieving significant BER improvements in the error floor region requires methods other than SNR increase.

One method for improving the error-floor characteristics of an LDPC decoding is to increase the codeword length. However, increasing codeword length also increases the memory and other computing resources required for LDPC decoding. Thus, if such resources are strictly limited, as is typically the case with the read-channel devices on HD drives, then other methods must be found to yield the necessary error-floor improvement.

Another scarce resource is processing cycles. Typically, to achieve a specified throughput, an HD drive budgets a fixed number of read-channel processing cycles for decoding a codeword. Methods which exceed that budget (i.e., off-the-fly methods) decrease the throughput. More desirable are on-the-fly methods which recover the DCCW within the clock-cycle allotment and thus do not decrease the throughput.

Trapping Sets, Flipping, Erasing, and Breaking

In a typical LDPC-decoding session, the decoder converges on the DCCW within the first several decoding iterations. When, instead, an LDPC decoder fails to converge on the DCCW within a specified maximum number of iterations, it is typically due to one of two scenarios. In the first scenario, the input codeword contains so many bit errors, i.e., so few correct values, that the decoder is unable to correct all the bit errors and outputs a vector x̂, also known as an invalid codeword (ICW), with a large number (e.g., greater than 15) of bit errors. A typical method for resolving an ICW is to request a re-send of the input codeword.

In the second scenario, the decoder resolves all but a few USCs, but those unresolved USCs and their erroneous bit nodes form a stable configuration, known as a trapping set, which is impervious to further iterations of that decoder. Trapping sets have a significant impact on the error-floor characteristics of an LDPC decoder. When an LDPC decoder fails to converge on the DCCW, it is often because of a trapping set.

Trapping sets are notated (a, b), where b is the number of USCs in the trapping set, and a is the number of erroneous bit nodes associated with those USCs. Thus, an (8,2) trapping set comprises two USCs and eight erroneous bit nodes (EBNs) associated with those two USCs. The majority of trapping sets comprise fewer than five USCs and fewer than ten EBNs.

A vector x̂ may possess more than one trapping set, but rarely more than three. Thus, when a decoder outputs a vector x̂ with 15 or fewer USCs, those USCs are typically members of a trapping set. If vector x̂ of a failed decoder contains a small number (e.g., less than 16) of USCs, then vector x̂ is referred to as a near codeword (NCW). Whereas an ICW is often handled by requesting a re-send of the input codeword, an NCW can be handled by altering values in the codeword or decoder parameters.

Flipping a bit node refers to a specific process for altering one or more values associated with the bit node. Which values are altered during flipping depends on the state of the LDPC decoder. If an LDPC decoder has just been initialized, i.e., the decoder is in State 0, then flipping a bit node comprises (i) inverting the hard-decision value of that bit node's $L_{ch}$ value, i.e., 1 becomes 0, and vice versa, and (ii) setting the magnitude bits, i.e., the confidence, of that same $L_{ch}$ value to maximum, and (iii) limiting the magnitude bits of all other $L_{ch}$ values to at most 15% of the maximum allowable magnitude value.

For example, assume a system with 4-bit $L_{ch}$ magnitude values, where the maximum allowable positive magnitude is +15 and the maximum allowable negative magnitude is −16, and where 15% of the maximum allowable values would be +2 and −2, respectively. Further assume four $L_{ch}$ values corresponding to four bit nodes: +2, −11, +1, +13. In this example, flipping the first bit node comprises (i) inverting the sign of the first bit node's $L_{ch}$ value, i.e., +2 becomes −2, (ii) setting the magnitude of the first bit node's $L_{ch}$ value to the maximum allowable value, i.e., −2 becomes −16, and (iii) limiting the magnitude of the $L_{ch}$ values of the other three bit nodes to at most 15% of the maximum allowable value, i.e., −11, +1, and +13 become −2, +1, and +2, respectively.

If the decoder is in some state other than State 0, then flipping a bit node comprises (i) determining the hard-decision value of the bit node's P value (defined by Equation 7 above), (ii) setting the hard-decision values of that bit node's $L_{ch}$ value, P value, and all associated $Q_{nm}$ messages to the opposite of the P value hard-decision value, (iii) setting the magnitude bits of that bit node's $L_{ch}$ value, P value, and all associated $Q_{nm}$ messages to maximum, and (iv) limiting the initial magnitude of the $L_{ch}$, P, and $Q_{nm}$ message values of all other bits to 15% of the maximum allowable value. Note that only initial magnitudes are limited. As the decoding session progresses, P and $Q_{nm}$ message values are updated and may assume any allowable value. $L_{ch}$ values, on the other hand, are read-only and thus will retain their limited magnitude values for the duration of the decoding session.

Erasing is another specific process for altering bit-node values. Erasing a bit node comprises (i) setting the hard-decision value of that bit node's $L_{ch}$ value to 0 and (ii) setting the magnitude bits, i.e., the confidence, of that same $L_{ch}$ value to 0, i.e., no confidence.

If one or more of the EBNs in a trapping set are adjusted (e.g., flipped or erased), then re-performing LDPC decoding on the resulting, modified trapping set may converge on the DCCW. When successful, this process is referred to as breaking the trapping set. Thus, another way to improve the error-floor characteristics of an LDPC decoder is to take the near codeword (NCW) of a failed decoder, identify potential EBNs in the NCW, flip or erase one or more of those EBNs, and submit the modified NCW for further LDPC processing. If flipping or erasing the EBNs breaks the trapping set in the NCW, then the resumed LDPC decoding will converge on the DCCW.

Some trapping sets can be broken by flipping or erasing a single EBN. In other trapping sets, flipping or erasing a single EBN may reduce the number of USCs, but not break the trapping set entirely, yielding a second, different trapping set. Yet other trapping sets can be broken only by flipping or erasing two or more EBNs at the same time.

Embodiments of the present invention are methods for yielding the DCCW from an NCW through targeted bit flipping or erasing. Specifically, from the set of all bit nodes (i.e., associated bit nodes (ABNs)) associated with USCs in the NCW, the methods identify an initial set (Set 1) of ABNs (i.e., the suspicious bit-nodes (SBNs)) which are most likely to be EBNs. Then, the methods select one or more SBNs from Set 1, flip or erase the selected SBNs, and submit the modified NCW to LDPC decoding. If the LDPC decoding converges on the DCCW, then the method terminates; otherwise, other SBNs or combinations of SBNs from Set 1 or other sets are selected for flipping or erasing, and decoding is performed until all specified combinations have been exhausted.

Embodiments of the present invention use any one of several different methods for identifying SBNs. One class of SBN-identification methods is the value-comparison methods. A value-comparison method first selects a set (i.e., node set) of one or more USC nodes and/or ABNs, e.g., all ABNs. The value-comparison method then selects a first node from the node set. The value comparison method then takes a first value associated with the first node, e.g., an $R_{mn}$ message value, and compares it a second value of a like kind, e.g., another $R_{mn}$ message value, associated with the same node. The second value can be from the same iteration/sub-iteration, or can be from another iteration/sub-iteration. If the difference between compared values exceeds a specified threshold, then either the ABN associated with the first value or the ABN associated with the second value is added to Set 1. The process is then repeated for each additional node in the node set.

A method wherein the node selected from the node set is an ABN is referred to as an ABN-based value-comparison method. In an ABN-based value-comparison method, the values available for comparison are the $R_{mn}$ message values, $Q_{nm}$ message values, and P values associated with the ABN. Furthermore, the comparison is between the complete values, i.e., both the sign bit and magnitude bits. Lastly, if the difference between compared values exceeds a specified threshold, then it is the selected ABN which is added to Set 1.

A method wherein the node selected from the node set is a USC is referred to as a USC-based value-comparison method. In a USC-based value-comparison method, the values available for comparison are the $R_{mn}$ and $Q_{nm}$ message values, i.e., no P values. Furthermore, the comparison is between only the magnitude bits of the two LLRs. Lastly, if the difference between compared values exceeds a specified threshold, then it is either the ABN associated with the first value or the ABN associated with the second value which is added to Set 1.

As described earlier, layered decoding involves multiple iterations, where each iteration may involve multiple sub-iterations. A value-comparison method that compares values from different iterations is referred to herein as an inter-iteration method. A value-comparison method that compares values from a single iteration is referred to herein as an intra-iteration method. A value-comparison method that compares values from different sub-iterations of a single iteration is referred to herein as an inter-sub-iteration method. Note that an inter-sub-iteration method is a particular type of intra-iteration method. Another type of intra-iteration method would be an intra-sub-iteration method that compares values from a single sub-iteration.

In an inter-iteration method, the difference between compared values is referred to herein as an inter-iteration difference value. In an inter-sub-iteration method, the difference between compared values is referred to herein as an inter-sub-iteration difference value. In an intra-sub-iteration method, the difference between compared values is referred to herein as an intra-sub-iteration difference value. Inter-sub-iteration difference values and intra-sub-iteration values are two types of intra-iteration difference values.

In order to avoid attempts at designing around certain embodiments of the present invention by including or excluding the case in which a difference value is exactly equal to the specified threshold, the term "exceeds" should be interpreted to cover embodiments in which ABNs are added to Set 1 when difference values are greater than a specified threshold as well as embodiments in which ABNs are added to Set 1 when difference values are greater than or equal to a specified threshold.

If a value-comparison method compares a first value, e.g., R message $R_{25}^7$ (i.e., R message value of check node 2 to bit node 5 in decoding iteration 7) to any one or more values of a like kind (i.e., another R message value, e.g., $R_{25}^6$, $R_{11}^2$, $R_{79}^{27}$, but not another Q message value or P value), then the method is said to compare similar values. If a value-comparison method compares a first value, e.g., $R_{25}^7$, to only R message values corresponding to the same check node and the same bit node, but from other iterations or sub-iterations, e.g., $R_{25}^6$ or $R_{25}^{11}$, then the method is said to compare specific values. Note that specific values are a type of similar value.

Thus, in one embodiment of the present invention, the value-comparison method is an inter-iteration ABN-based specific-value method wherein Set 1 is the set of all ABNs whose $Q_{nm}$ message, $R_{mn}$ message, and/or P values change significantly from one LDPC decoding iteration to the next. This embodiment applies to both layered and non-layered decoders. Our research has shown that the values associated with EBNs often change drastically from one LDPC-decoding iteration to the next.

For example, Set 1 might contain all ABNs, any of whose inter-iteration difference values $Qchange^i$ exceed a pre-defined threshold, where $Qchange^i$ is given by the following Equation 8:

$$Q\text{change}^i = |Q_{nm}^i - Q_{nm}^{i-1}| \qquad (8)$$

where i represents the ith LDPC decoding iteration and excludes the first decoding iteration. Similarly, Set 1 might contain all ABNs, any of whose inter-iteration value changes $Rchange^i$ exceed a pre-defined threshold, where $Rchange^i$ is given by the following Equation 9:

$$R\text{change}^i = |R_{mn}^i - R_{mn}^{i-1}| \qquad (9)$$

where i represents the ith LDPC decoding iteration and excludes the first decoding iteration.

In another embodiment of the present invention, the value-comparison method is an ABN-based similar-value intra-iteration method, wherein Set 1 is the set of all ABNs whose values, in any given iteration of a layered or non-layered decoder, differ from one another by more than a specified intra-iteration difference threshold. In a layered decoder, the intra-iteration different values would be based on $Q_{nm}$ message values, $R_{mn}$ message values, and/or P values. In a non-layered decoder, because only a single P value is generated for each iteration, the intra-iteration difference values would be based on $Q_{nm}$ message values and/or $R_{mn}$ message values.

For an example in a non-layered decoder, assume a bit node which is connected to four check nodes, and further assume a specified threshold of 6. If, during any LDPC decoding iteration, any one of four $Q_{nm}$ messages sent to the bit node differs from any of the other three by more than 6, then the bit node is added to Set 1. Thus, if three of the $Q_{nm}$ messages for a bit node had a value of −7 and one had a value of +2, then the bit node would be added to Set 1, because the intra-iteration difference value between −7 and +2 (i.e., 9) is greater than the threshold of 6.

For an example in a layered decoder, assume a bit node and a layered decoder with four layers. Four different P values will be generated during each decoding iteration, one for each sub-iteration. If one of the P values differs from the other three by more than a specified intra-iteration difference threshold, then the bit node will be added to Set 1.

In another embodiment of the present invention, the value-comparison method is an ABN-based similar-value inter-sub-iteration method, wherein Set 1 is the set of all ABNs whose $Q_{nm}$ message, $R_{mn}$ message, and/or P values, in any given sub-iteration of a layered decoder, differ from the corresponding values of the previous sub-iteration by more than a specified inter-sub-iteration difference threshold.

Thus, for example, assume an H matrix with four layers, and a bit node which is connected to a single check node in each layer, and thus receives a single $R_{mn}$ message during the processing of each layer, i.e., during each sub-iteration. Further assume that the layers are processed in the order 1-2-3-4. If the $R_{mn}$ message value of layer 2 differs from the $R_{mn}$ message value of layer 1 by more than the specified threshold, then the bit node is added to Set 1. Similarly, the layer 3 $R_{mn}$ value is compared to the layer 2 $R_{mn}$ value, and layer 4 is compared to layer 3. Non-consecutive layers are not compared, e.g., the $R_{mn}$ value of layer 4 would not be compared to the $R_{mn}$ value of layer 1.

In another embodiment of the present invention, the value comparison method is an ABN-based specific-value inter-sub-iteration method, e.g., a $Q_{24}$ message value is compared to only a $Q_{24}$ message value from another sub-iteration.

In yet another embodiment of the present invention, the value-comparison method is an ABN-based similar-value intra-sub-iteration method, wherein Set 1 is the set of all ABNs whose values, in any given iteration of a layered or non-layered decoder, differ from one another by more than a specified intra-iteration difference threshold.

In yet another embodiment of the present invention, the value comparison methods are USC-based value-comparison methods that compare either (i) the magnitudes of all $Q_{nm}$ messages sent to a USC, or (ii) the magnitudes of all $R_{mn}$ messages sent by a USC. In the case of $Q_{nm}$ message comparison, the ABN which sent the $Q_{nm}$ with the lowest magnitude is selected for Set 1. In the case of $R_{mn}$ message comparison, the ABN which receives the $R_{mn}$ with the greatest magnitude is selected for Set 1.

Certain embodiments of the present invention use SBN-selection methods which are not based on value comparisons. For example, in one embodiment of the present invention, Set 1 is the set of all ABNs.

In yet another embodiment of the present invention, Set 1 is the set of all ABNs whose P values (see Equation 7, above) saturate within a specified number of decoding iterations. Saturation refers to when a calculated LLR value exceeds the range of LLR values allowed by the notation system. For example, assume a system wherein the range of allowable LLR values is −15 (i.e., hard bit-value of 0 with maximum confidence) to +16 (i.e., hard bit-value of 1 with maximum confidence). If Equation 7 above yields a P value of +18, then that P value will be represented as +16, and that P value will be said to have saturated. Our research has shown that the P values of EBNs often saturate within the first several LDPC-decoding iterations.

In yet another embodiment of the present invention, Set 1 is the set of all ABNs whose P values (see Equation 7, above) and E values (see Equation 6, above) have opposite signs, e.g., a positive P value and a negative E value, or vice versa. Our research has shown that bit nodes with positive P values and a negative E values, or vice versa, are often EBNs.

In yet another embodiment of the present invention, Set 1 is the set of all ABNs whose P values (see Equation 7, above) and $L_{ch}$ values have opposite signs.

Figure 4:
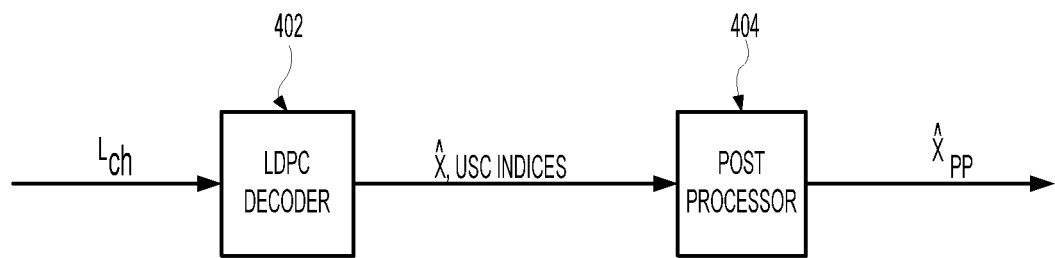
FIG. 4 is a block diagram of LDPC decoding system 400 according to one embodiment of the invention.

FIG. 4 is a block diagram of LDPC decoding system 400 according to one embodiment of the invention. System 400 is analogous to LDPC decoder 112 of FIG. 1. LDPC decoder 402 receives $L_{ch}$ values from a read processor analogous to read processor 110 of FIG. 1, and performs LDPC decoding to generate the decoded codeword vector $\hat{x}$. If vector $\hat{x}$ is the decoded correct codeword, then processing of LDPC decoding system 400 terminates without employing post-processor 404. If vector $\hat{x}$ contains one or more USCs, i.e., vector $\hat{x}$ is not the DCCW, then LDPC decoder 402 outputs vector $\hat{x}$ and the indices of the USCs to post-processor 404. If vector $\hat{x}$ is not the DCCW, then post-processor 402 performs one or more post-processing methods, serially or in parallel, on vector $\hat{x}$ to attempt to generate the DCCW. When finished, post-processor 404 outputs vector $\hat{x}_{pp}$ to further downstream processing, where vector $\hat{x}_{pp}$ might or might not be the DCCW depending on whether or not post-processor 404 succeeded in breaking the trapping set corresponding to vector $\hat{x}$.

Figure 5:
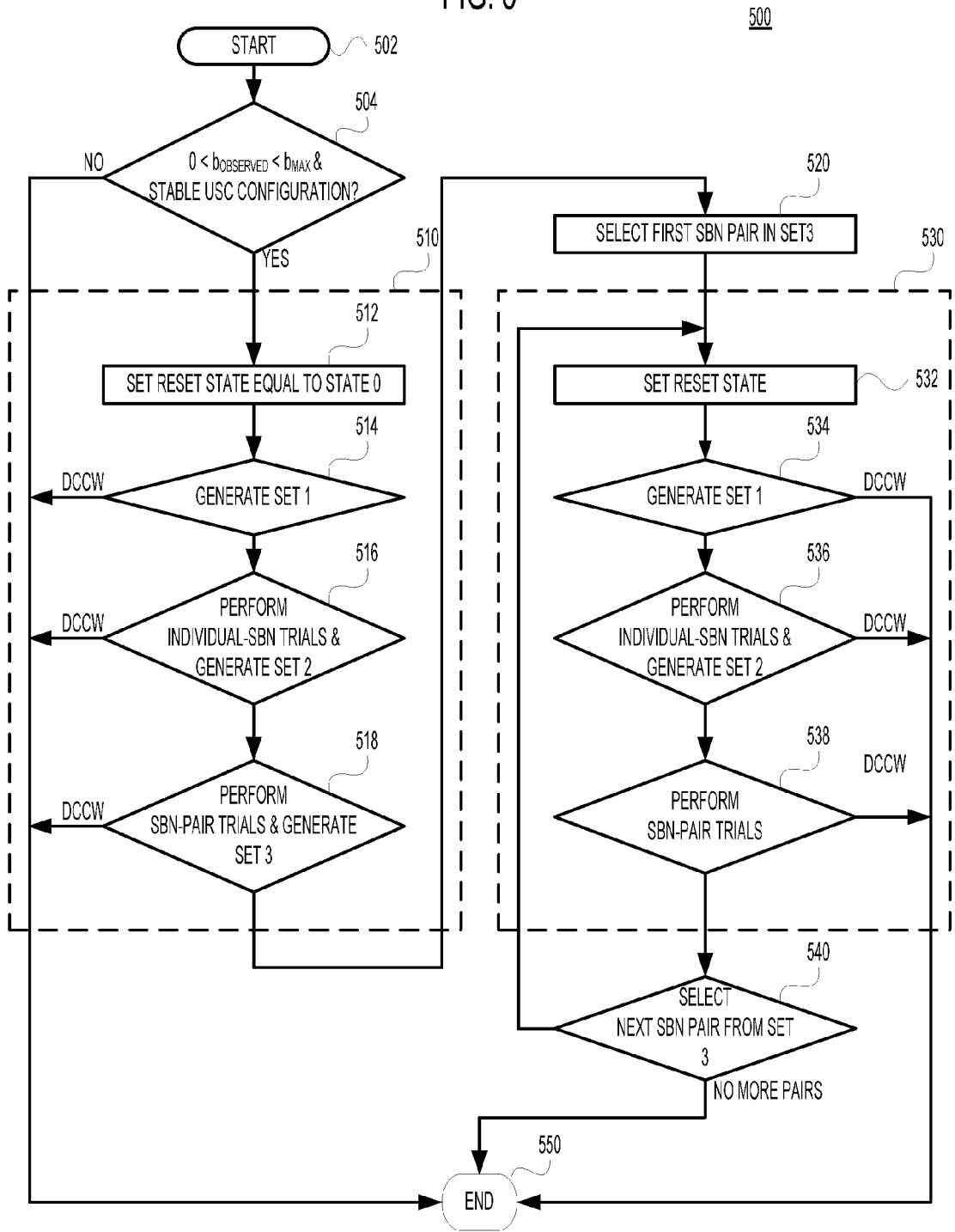
FIG. 5 is a flowchart of exemplary targeted bit-flipping process 500 used by post-processor 404 of FIG. 4, according to one embodiment on the present invention.

FIG. 5 is a flowchart of exemplary targeted bit-flipping process 500 used by post-processor 404 of FIG. 4, according to one embodiment on the present invention. Although process 500 is bit-flipping process, it should be understood that the present invention can also be implemented in the context of bit-adjustment processes that erase bits instead of flipping bits, as well as in the context of bit-adjustment processes that involve both bit flipping and bit erasing, Furthermore, the present invention can be implemented in the context of types of bit adjustment other than the specific flipping and/or erasing of bits described earlier. Process 500 contains two analogous sub-processes 510 and 530.

Sub-process 510 is implemented (at most) one time. During sub-process 510, the trapping set corresponding to the failed decoding of LDPC decoder 402 of FIG. 4 is attempted to be broken by sequentially flipping one or more individual associated bit nodes (ABNs) associated with the set of unsatisfied check nodes (USCs) corresponding to the failed decoding of LDPC decoder 402 and, if that individual node-flipping fails, then by sequentially flipping one or more pairs of those ABNs. If sub-process 510 fails to break the trapping set, then sub-process 530 is implemented one time for each of one or more of the flipped pairs of ABNs from sub-process 510.

For each flipped pair of ABNs, sub-process 530 defines a new set of USCs and a new set of ABNs associated with those USCs. Like sub-process 510, sub-process 530 attempts to break the trapping set by sequentially flipping one or more individual ABNs associated with the new set of USCs and, if individual node-flipping fails, then by sequentially flipping one or more pairs of those ABNs.

Sub-processes 510 and 530 perform the same basic steps. Specifically, a set (i.e., Set 1) of one or more suspicious bit-nodes (SBNs) (i.e., ABNs that are most likely to be erroneous bit-nodes (EBNs)) is generated (i.e., step 514 for sub-process 510 and step 534 for sub-process 530). Then one or more trials are sequentially performed for one or more individual SBNs (i.e., step 516 for sub-process 510 and step 536 for sub-process 530) and then, if necessary, one or more trials are sequentially performed for one or more pairs of SBNs (i.e., step 518 for sub-process 510 and step 538 for sub-process 530). Each trial comprises (i) resetting the decoder to a specified, appropriate reset state, (ii) flipping the selected individual SBN or pair of SBNs, and (iii) re-performing decoding. If any trial yields the DCCW, then the process terminates at step 550.

Sub-processes 510 and 530 differ (i) in how many times they are performed and (ii) in their reset states. Sub-process 510 is performed at most once. Furthermore, the reset state for sub-process 510 is either (i) the original initialization state of the LDPC decoder (i.e., State 0) or (ii) the state of the LDPC decoder after performing a fixed number of iterations from State 0 (i.e., State 1).

In contrast, sub-process 530 may be performed any number of times. Furthermore, the reset state for each implementation of sub-process 530 may differ (i) from the reset states of other implementations of sub-process 530 and (ii) from the reset states of sub-process 510.

Process 500 begins at step 502 and proceeds to step 504 where it is determined whether vector $\hat{x}$ is an appropriate candidate for process 500, i.e., vector $\hat{x}$ is a near codeword which contains one or more trapping sets. As discussed above, trapping sets are stable configurations of typically one to five USCs, and a near codeword typically contains one to three trapping sets. Thus, in the embodiment of FIG. 5, to be an appropriate candidate for process 500, (i) vector $\hat{x}$ must possess a number ($b_{observed}$) of USCs greater than 0 and less than a pre-defined threshold $b_{max}$ (typically 16), and (ii) the particular configuration of USCs must have remained stable (i.e., unchanged) for the last two or three iterations of LDPC decoder 402 of FIG. 4.

Process 500 is designed to work with trapping sets in near codewords (NCW), and works by flipping bit nodes associated with USCs. Thus, if vector $\hat{x}$ possesses no USCs, i.e., vector $\hat{x}$ is a near-codeword mis-correction (NCW-MC), then process 500 cannot determine which bit nodes to flip. As such, near-codeword mis-corrections typically should be passed to other post-processing methods for resolution. Similarly, if vector $\hat{x}$ possesses more than $b_{max}$ USCs, then vector $\hat{x}$ is most likely an invalid codeword (ICW), and typically should be passed to a post-processing methods which are designed to handle ICWs. Lastly, a set of USCs which appears in the last or next-to-last decoding iteration is most likely not a trapping set, but the result of some other problem with the decoding process, and as such should be addressed by other post-processing processes.

Accordingly, if step 504 evaluates false, then process 500 terminates at step 550; otherwise, processing proceeds to step 512 where the reset state is set equal to the decoder state upon initialization (State 0).

Next, at step 514, post-processor 404 identifies a set (i.e., Set 1) of one or more suspicious bit-nodes (SBNs) (i.e., ABNs that are most likely to be erroneous bit-nodes (EBNs)) and defines reset State 1. Further details describing step 514 are found in FIG. 6, which is described below.

Next, at step 516, individual-SBN trials are performed using SBNs selected from Set 1. If an individual-SBN trial converges on the DCCW, then process 500 terminates at step 550. If an individual-SBN trial does not yield the DCCW, but does yield a number b of USCs lower than $b_{observed}$, then the individual SBN is added to a new set (i.e., Set 2). If all individual-SBN trials are performed without yielding the DCCW, then processing continues to step 518. Further details describing step 516 are found in FIG. 7, which is described below.

Next, at step 518, SBN-pair trials are performed using pairs of SBNs selected from Set 2. If an SBN-pair trial converges on the DCCW, then process 500 terminates at step 550. If an SBN-pair trial does not yield the DCCW, then the number b of USCs in the resulting codeword is recorded. If all SBN-pair trials are performed without yielding the DCCW, then a new Set 3 is created which contains the one or more SBN pairs which yielded the lowest number b of USCs in their resulting codewords. Process 500 then continues to step 520. Further details describing step 518 are found in FIG. 8, which is described below.

Next, at step 520, a first SBN pair is selected from Set 3. Next, at step 532, the decoder is reset to State 1, the selected SBN pair is flipped, the decoder is run a fixed number of decoding iterations, and the resulting decoder state (State 2) becomes the new reset state. Further details describing step 532 are found in FIG. 9, which is described below.

Next, at step 534, a new Set 1 is generated and a new State 1 is defined. Step 534 is identical to step 514 of sub-process 510, except that step 514 starts the LDPC decoder from State 0, whereas step 534 starts the LDPC decoder from State 2. If step 534 generates the DCCW, then processing terminates at step 550; otherwise, processing continues to step 536.

Next, at step 536, individual-SBN trials are performed using the SBNs from the new Set 1, and those individual-SBNs that yield a lower b are stored in a new Set 2. Step 536 is identical to step 516 of sub-process 510, except that step 516 starts the LDPC decoder from State 0, whereas step 536 starts the LDPC decoder from State 2. Furthermore, step 536 uses the new Set 1 generated by step 534, while step 516 uses the Set 1 generated by step 514. If step 536 generates the DCCW, then processing terminates at step 550; otherwise, processing continues to step 538.

Next, at step 538, SBN-pair trials are performed using SBN pairs from the new Set 2. Step 538 is similar to step 519 of sub-process 510 except that a new Set 3 is not generated. If step 538 generates the DCCW, then processing terminates at step 550: otherwise, processing continues to step 540.

Next, at step 540, the next SBN pair is selected from Set 3. If another pair is selected, then processing loops to step 532. If, instead, there are no more SBN pairs in Set 3, then processing terminates at step 550. In one embodiment, the only SBN pairs from sub-process 510 that are used to implement sub-process 530 are those SBN pairs whose SBN-trials generate the lowest number b of USCs. In alternative embodiments, other criteria are used to select the SBN pairs for sub-process 530, such as a specified percentage or fixed number of SBN-pairs which generate the lowest b values.

Figure 6:
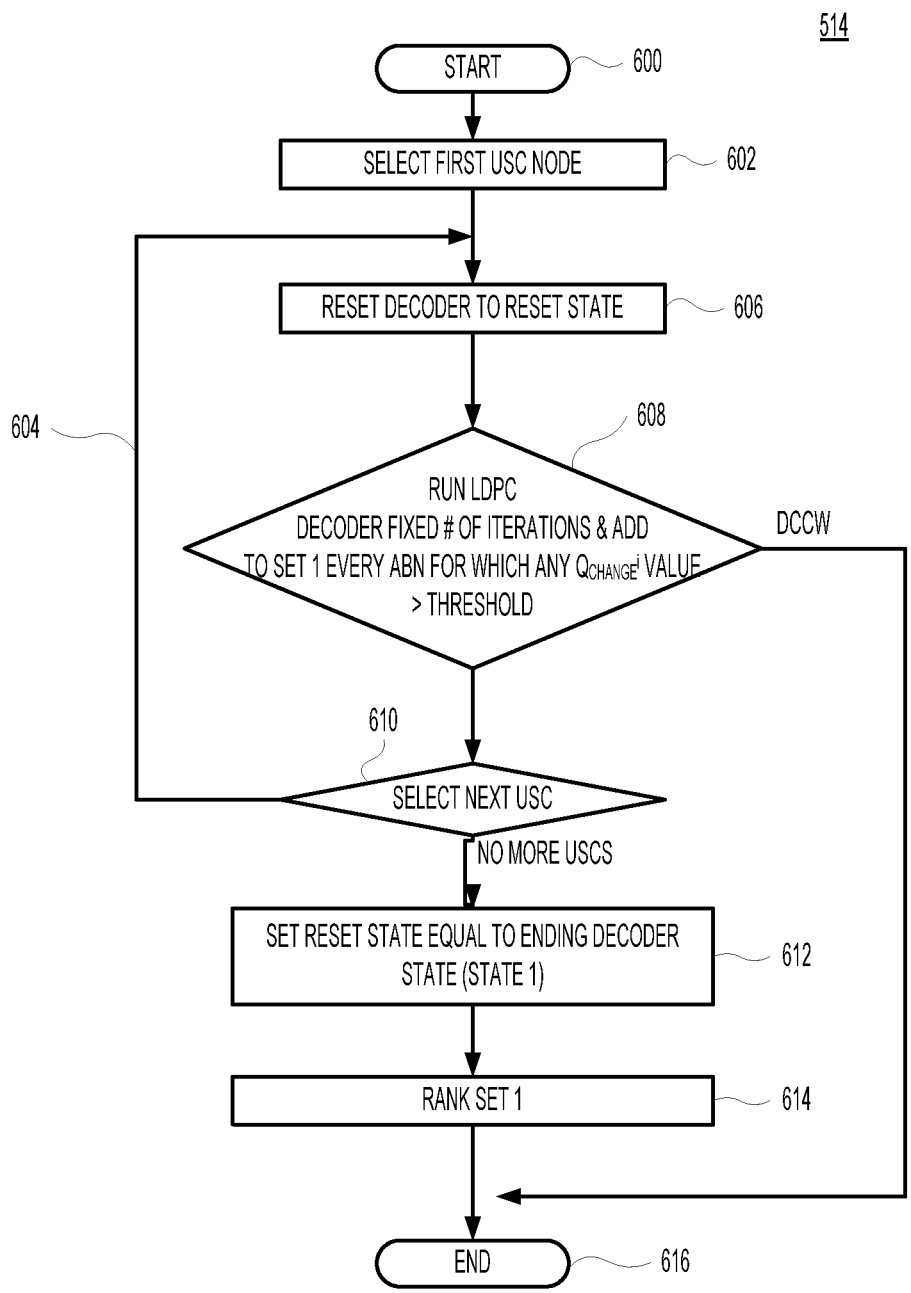
FIG. 6 is a flow diagram of step 514 of FIG. 5.

FIG. 6 is a flow diagram of step 514 of FIG. 5. The implementation of step 514 shown in FIG. 6 corresponds to the definition of Set 1 as the set of all ABNs whose $Q_{nm}$ message values change significantly from one LDPC decoding iteration to the next. Other implementations, e.g., based on the alternative definitions of Set 1 described earlier, are also possible.

Processing begins at step 600 and proceeds to step 602 where a first USC out of the set of all USCs is selected. After step 602, process 514 enters loop 604 comprising steps 606, 608, and 610. At step 606, the LDPC decoder is reset to the reset state (State 0), i.e., the decoder is initialized.

At step 608, an LDPC decoder is run for a pre-defined number of iterations, e.g., 50, and all the associated bit nodes (ABNs) associated with the selected USC are monitored. The LDPC decoder of step 608 is similar to LDPC decoder 300 of FIG. 3, with the exception that step 304 (decoder initialization) is omitted.

Set 1 of SBNs is generated based on observed changes in bit-node LLR values. Which LLR values are monitored, and what specific changes identify an SBN, will vary from embodiment to embodiment. In the exemplary embodiment of FIG. 6, all $Q_{nm}$ values sent to the selected USC are monitored. SBNs with Qchange$^i$ values (see Equation 8, above) greater than a specified threshold are added to Set 1.

In another embodiment, process 500 is the same, except that step 608 monitors $R_{mn}$ value changes and adds to Set 1 those ABNs whose Rchange$^i$ values (see Equation 9, above) exceed a specified threshold. In yet another embodiment, the P values (see Equation 7, above) are monitored, and those ABNs whose P values saturate within the pre-defined number of iterations are added to Set 1. In yet another embodiment, both the P values and E values (see Equation 6, above) are monitored, and those ABNs whose P values and E values possess opposite signs are added to Set 1. Other than these internal changes to step 608, process 500 is the same for all these embodiments. If, however, the particular embodiment represented by process 500 is one where every ABN is an SBN, then step 608 would observe no LLR values and add all ABNs to Set 1. Otherwise, the steps of process 500 are identical for all embodiments.

Next, at step 610, the next USC out the set of all USCs is selected, and loop 604 repeats. If there are no more USCs, then processing continues to step 612, where the decoder state after performing the fixed number of iterations is stored as State 1, and the reset state is set equal to State 1 Subsequent decoding operations will start from State 1 (e.g., after 50 iterations) rather than from State 0 (i.e., initialization).

Next, at step 614, the SBNs of Set 2 are ranked according to their probability of being an EBN. In the exemplary embodiment of FIG. 6, the SBNs of Set 2 are ranked by Qchange$^i$ values. In some embodiments of the present invention, the ranking of step 614 would be eliminated. For example, if Set 1 is all ABNs which possess P values and E values of opposite sign, then ranking is unnecessary.

Process 514 then terminates at step 616.

Figure 7:
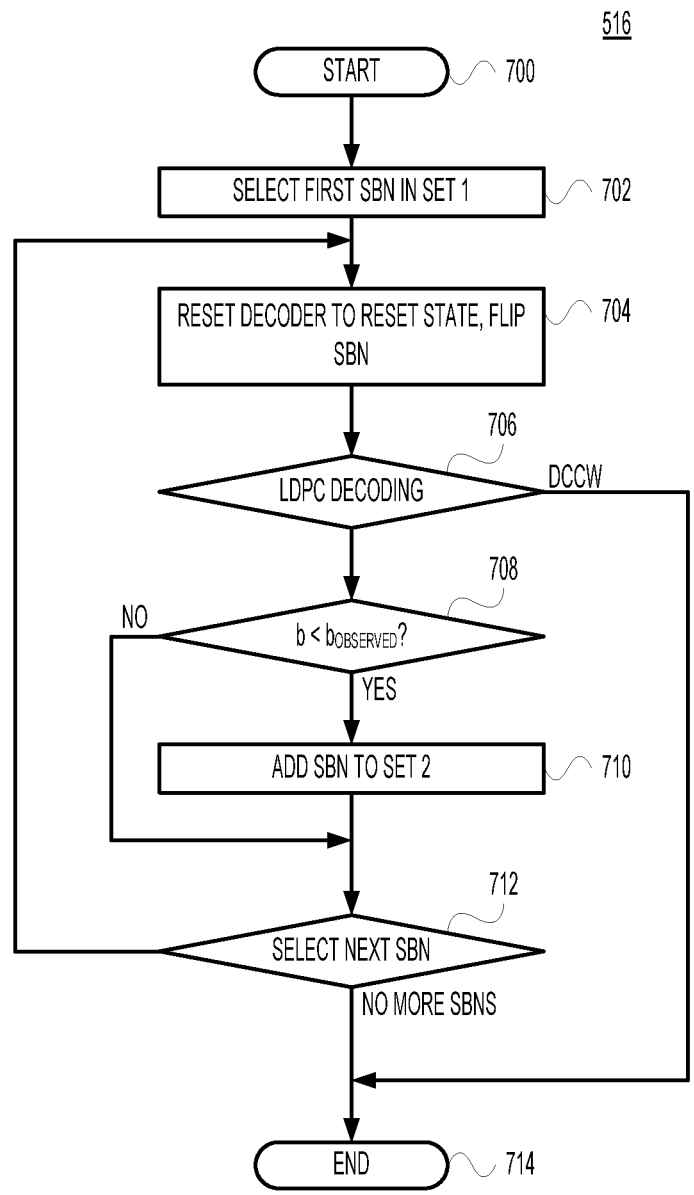
FIG. 7 is a flow diagram of step 516 of FIG. 5.

FIG. 7 is a flow diagram of step 516 of FIG. 5. In step 516, individual-SBN trials are performed.

Processing begins at step 700 and proceeds to step 702 where a first SBN in Set 1 is selected. Next, at step 704, process 516 enters a loop comprising steps 704, 706, 708, 710, and 712. At step 704, the decoder is reset to the reset state, and the selected SBN is flipped.

Next, at step 706, LDPC decoding is performed for a defined number of iterations. The LDPC decoder of step 706 is identical to the LDPC decoder of step 608 of FIG. 6. If the decoder converges on the DCCW, then process 516 terminates at step 714; otherwise, processing continues to step 708.

At step 708, the resulting number b of USCs is compared to $b_{observed}$. If b is less than $b_{observed}$, then processing continues to step 710; otherwise, processing continues to step 712. At step 710, the selected SBN is added to a Set 2. Processing then continues to step 712.

Next, at step 712, a next SBN is selected from Set 1 and processing loops back to step 704. If there are no more SBNs in Set 1, then process 516 terminates at step 714.

Figure 8:
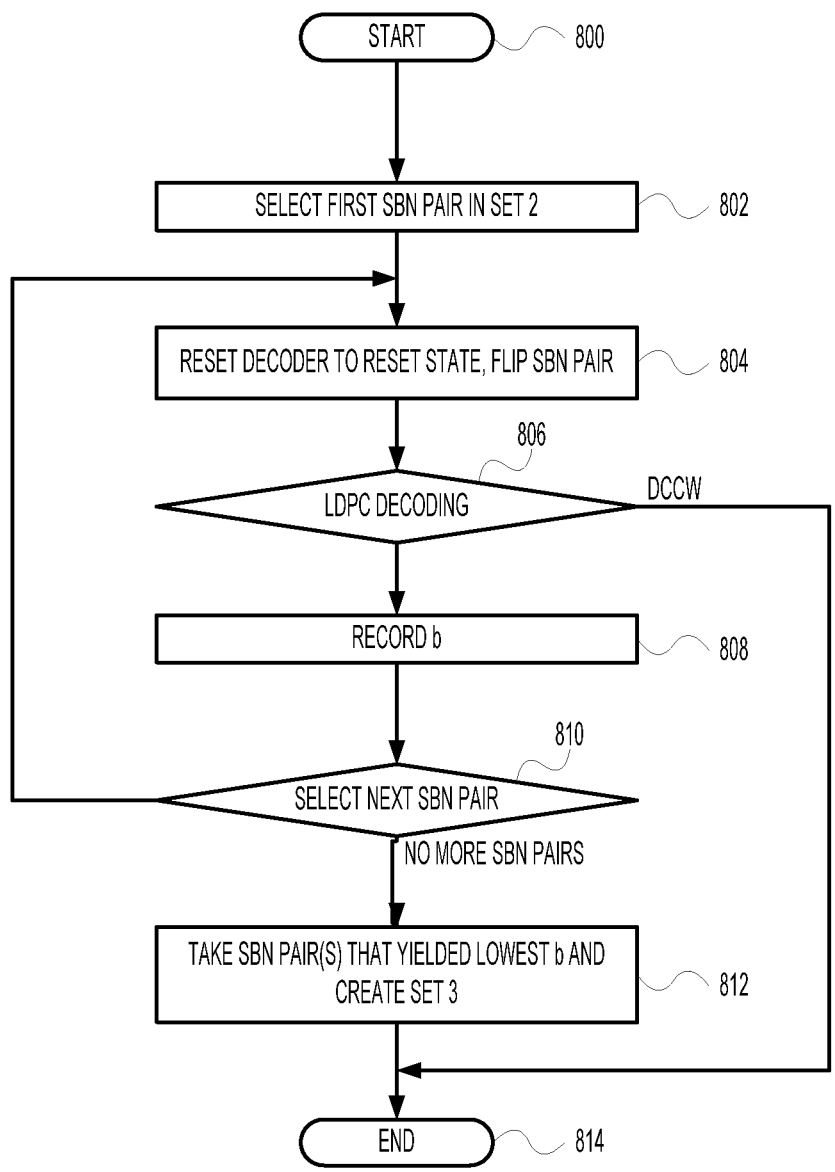
FIG. 8 is a flow diagram of step 518 of FIG. 5.

FIG. 8 is a flow diagram of step 518 of FIG. 5. Processing begins at step 800 and proceeds to step 802, where a first SBN pair is generated from the SBNs of Set 2. One constraint on pair creation is that there be at least one USC which is not common to both SBNs. In other words, if SBN a1 is associated with only USC b1, and SBN a2 is similarly associated with only USC b1, then a1 and a2 would not be a valid pair. The reason for this constraint is that if b1 is a USC, i.e., b1 does not satisfy its parity check, then an odd number of bits must be flipped if the parity check is to be satisfied. Flipping an even number of bits will not satisfy the parity check.

In other embodiments of the present invention, other constraints might be imposed on SBN-pair creation in step 802. For example, the SBNs available for SBN-pair creation might be limited to those SBNs, any of whose trials satisfy the conditions $(b_{old}-b_{new}) \geq a_e$ and $b_{new} < b_{max}$, where $b_{old}$ is the number b of USCs before the trial, $b_{new}$ is the number b of USCs after the trial, $a_e$ is the number of bit nodes whose hard decisions are flipped as a result of the trial, and $b_{max}$ is the maximum number b of USCs that a near codeword can possess and still be processed by process 500.

Next, process 518 enters a loop comprising steps 804, 806, 808, and 810. At step 804, the decoder is reset to the reset state, and the selected SBN pair is flipped. Then, at step 806, LDPC decoding is re-performed. The LDPC decoder of step 806 is identical to LDPC decoder 608 of FIG. 6. If the decoding of step 806 yields the DCCW, then process 518 terminates at step 814; otherwise, processing continues to step 808.

At step 808, the resulting b value at the end of step 806 is recorded for the current SBN pair. Next, at step 810, the next SBN pair from Set 2 is selected, and processing loops back to step 804. If, instead, at step 810, there are no more SBN pairs in Set 2, then processing proceeds to step 812.

At step 812, the SBN pair(s) which yielded the lowest b value at step 808 are saved as Set 3. Other criteria for generating Set 3 are possible. For example, Set 3 could include a specified number of SBN pairs having the smallest b values, whether those b values are the same or not. Process 518 then terminates at step 814.

Figure 9:
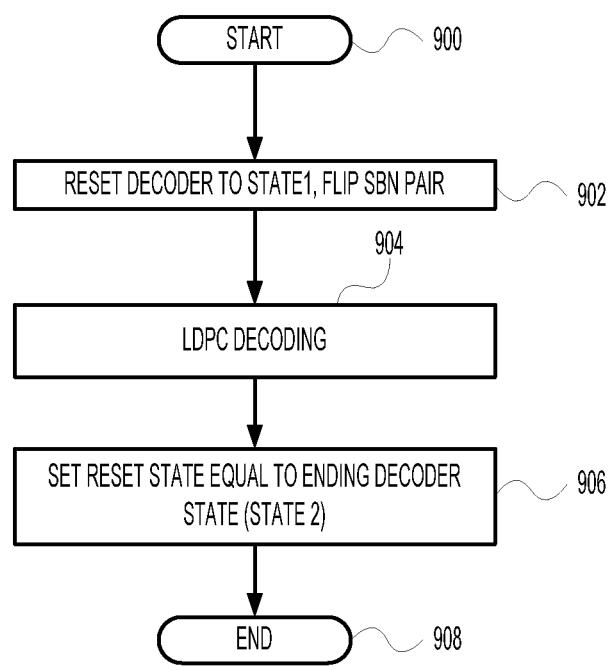
FIG. 9 is a flow diagram of step 532 of FIG. 5.

FIG. 9 is a flow diagram of step 532 of FIG. 5. Processing begins at step 900 and proceeds to step 902 where the decoder is reset to State 1, and a first SBN pair is selected from Set 3 and flipped. Next, at step 904, LDPC decoding is performed for a specified number of iterations. The LDPC decoder of step 904 is identical to the LDPC decoder of step 608 of FIG. 6. Next, at step 906, the ending decoder state is stored as State 2, and the reset state is set equal to State 2. Process 532 then terminates at step 908.

Although the exemplary process 500 of FIG. 5 generates Set 1 by simultaneously monitoring all bit-nodes associated with a single, selected USC (e.g., step 608 of FIG. 6), the invention is not so limited. Instead, bit nodes could be monitored one by one, or, alternatively, all bit nodes for all USCs could be monitored at once.

Further, although the exemplary process 500 of FIG. 5 flips only single SBNs and pairs of SBNs, the present invention is not so limited. Specifically, any number of SBNs could be flipped at once, up to and including the number of SBNs in Set 2.

Yet further, although exemplary process 500 of FIG. 5 comprises multiple iterations of two sets of trials, i.e., a set of individual-SBN trials followed by a set of SBN-pair trials, the present invention is not so limited by the number of trial sets, the types of trials, or their sequence. For example, alternative processes could have three sets of SBN-pair trials followed by seven individual-SBN trials followed by two sets of SBN-triplet trials.

Furthermore, although exemplary process 500 of FIG. 5 specifies a particular way in which the results of one step affect (i) the starting decoder state of subsequent steps and (ii)

the set of SBNs to be used by subsequent steps, the invention is not so limited. For example, the starting decoder state for step 516 is not dependent on the results of step 514, but always starts from the same State 1. An alternative embodiment of the present invention could, for example, take the ending decoder state from the individual-SBN trials of step 516 that yielded the lowest number b of USCs, and use that state as the starting state for each iteration of step 518. Similarly, although process 500 specifies that step 518 will use Set 2 in generating pairs of SBNs, an alternative embodiment could have step 518 using Set 1 to generate SBN pairs.

Although the present invention has been described in the context of hard disk drives that implement LDPC coding and decoding, the invention is not so limited. In general, the present invention can be implemented in any suitable communication path that involves LDPC coding and decoding.

Further, although the exemplary belief-propagation algorithm used above is the offset min-sum algorithm (OMS), the present invention is not so limited, and can be used with any belief-propagation variant, e.g., sum-product algorithm (SPA) or the Bahl-Cocke-Jelinek-Raviv (BCJR) algorithm.

Yet further, although the belief-propagation example used above employed a specific decoding schedule (flooding schedule) where all check nodes were updated during a single check-node update step, followed by all bit nodes being updated in a single bit-node update step, the present invention is not so limited, and can be used with any decoding schedule, e.g., row-serial schedule, column-serial schedule, and row-column serial schedule.

Yet further, although the exemplary LDPC decoder used above was a non-layered decoder, the present invention is not so limited, and can be used with both layered and non-layered decoders.

Yet further, although embodiments of the present invention have been described in the context of LDPC codes, the present invention is not so limited. Embodiments of the present invention could be implemented for any code which can be defined by a graph, e.g., tornado codes, structured IRA codes, since it is graph-defined codes which suffer from trapping sets.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

What is claimed is:

1. A method for decoding encoded data using bit nodes and check nodes, the method comprising:
   (a) performing iterative decoding on the encoded data to generate an original near codeword having one or more unsatisfied check nodes, each unsatisfied check node having one or more associated bit nodes, the one or more associated bit nodes for the one or more unsatisfied check nodes forming a set of associated bit nodes;
   (b) identifying, from the set of associated bit nodes, a first set of suspicious bit nodes that may be erroneous bit nodes for the original near codeword;
   (c) adjusting at least one of the suspicious bit nodes in the first set to generate a modified near codeword; and
   (d) performing iterative decoding on the modified near codeword to attempt to generate a decoded correct codeword for the encoded data, wherein:
       step (c) followed by step (d) is implemented multiple times for different modified near codewords; and
       at least one of steps (a)-(d) is implemented in a processor.

2. The invention of claim 1, wherein step (b) comprises identifying the set of associated bit nodes as the first set of suspicious bit nodes.

3. The invention of claim 1, wherein step (b) comprises:
   (b1) determining difference values over one or more decoding iterations, wherein each difference value corresponds to a difference between first and second values associated with a common associated bit node;
   (b2) comparing the difference values to a specified threshold; and
   (b3) selecting, as the first set, associated bit nodes with difference values having magnitudes that exceed the specified threshold.

4. The invention of claim 3, wherein the first and second values are generated during a single decoding iteration.

5. The invention of claim 4, wherein:
each decoding iteration comprises one or more decoding sub-iterations; and
the first and second values are generated during a single decoding sub-iteration.

6. The invention of claim 4, wherein:
at least one decoding iteration comprises two or more decoding sub-iterations; and
the first and second values are generated during different decoding sub-iterations.

7. The invention of claim 3, wherein the first and second values are generated during different decoding iterations.

8. The invention of claim 3, wherein the first and second values are either two bit-node message values, two check-node message values, or two P values.

9. The invention of claim 3, wherein the first and second values are similar values.

10. The invention of claim 9, wherein the first and second values are specific values.

11. The invention of claim 1, wherein step (b) comprises:
(b1) determining whether P values saturate during one or more decoding iterations for different associated bit nodes; and
(b2) selecting, as the first set, associated bit nodes having a P value that is determined to saturate in step (b1).

12. The invention of claim 1, wherein step (b) comprises:
(b1) determining signs of first and second values after one or more decoding iterations, wherein the first and second values are both associated with either a common associated bit node or a common unsatisfied check node;
(b2) comparing the signs of the first and second values; and
(b3) selecting, as the first set, associated bit nodes based on first and second values determined to have opposite sign in step (b2).

13. The invention of claim 12, wherein the first value is a P value and the second value is an E value.

14. The invention of claim 12, wherein the first value is a P value and the second value is an $L_{ch}$ value.

15. The invention of claim 1, wherein:
each unsatisfied check node is associated with one or more bit-node messages; and
step (b) comprises, for each unsatisfied check node:
(b1) selecting a bit-node message with the least magnitude value; and
(b2) selecting the associated bit node associated with the selected bit-node message to be in the first set.

16. The invention of claim 1, wherein:
each unsatisfied check node is associated with one or more check-node messages; and
step (b) comprises, for each unsatisfied check node:
(b1) selecting a check-node message with the greatest magnitude value; and
(b2) selecting the associated bit node associated with the selected check-node message to be in the first set.

17. The invention of claim 1, wherein, for each implementation of step (c), a corresponding modified near codeword for step (d) is generated by adjusting one or more suspicious bit nodes in the original near codeword.

18. The invention of claim 1, wherein, for at least one implementation of step (c), a corresponding modified near codeword for step (d) is generated by adjusting one or more suspicious bit nodes in a near codeword generated during a previous implementation of step (d).

19. The invention of claim 1, wherein for at least one implementation of step (c), a corresponding modified near codeword for step (d) is generated by adjusting only one suspicious bit node in a near codeword.

20. The invention of claim 1, wherein for at least one implementation of step (c), a corresponding modified near codeword for step (d) is generated by adjusting a pair of suspicious bit nodes in a near codeword.

21. The invention of claim 1, wherein the decoding is low-density parity check decoding.

22. The invention of claim 1, wherein step (c) comprises flipping or erasing the at least one suspicious bit node in the first set to generate the modified near codeword.

23. Apparatus for decoding encoded data using bit nodes and check nodes, the apparatus comprising:
(a) means for performing iterative decoding on the encoded data to generate an original near codeword having one or more unsatisfied check nodes, each unsatisfied check node having one or more associated bit nodes, the one or more associated bit nodes for the one or more unsatisfied check nodes forming a set of associated bit nodes;
(b) means for identifying, from the set of associated bit nodes, a first set of suspicious bit nodes that may be erroneous bit nodes for the original near codeword;
(c) means for adjusting at least one of the suspicious bit nodes in the first set to generate a modified near codeword; and
(d) means for performing iterative decoding on the modified near codeword to attempt to generate a decoded correct codeword for the encoded data, wherein at least one of:
(i) the means for identifying the first set of suspicious bit nodes comprises:
(b1) means for determining difference values over one or more decoding iterations, wherein each difference value corresponds to a difference between first and second values associated with a common associated bit node;
(b2) means for comparing the difference values to a specified threshold; and
(b3) means for selecting, as the first set, associated bit nodes with difference values having magnitudes that exceed the specified threshold;
(ii) the means for identifying the first set of suspicious bit nodes comprises:
(b1) means for determining whether P values saturate during one or more decoding iterations for different associated bit nodes; and
(b2) means for selecting, as the first set, associated bit nodes having a P value that is determined to saturate;
(iii) the means for identifying the first set of suspicious bit nodes comprises:
(b1) means for determining signs of first and second values after one or more decoding iterations, wherein the first and second values are both associated with either a common associated bit node or a common unsatisfied check node;
(b2) means for comparing the signs of the first and second values; and
(b3) means for selecting, as the first set, associated bit nodes based on first and second values determined to have opposite sign;

(iv) each unsatisfied check node is associated with one or more bit-node messages; and
  the means for identifying the first set of suspicious bit nodes comprises:
  (b1) means for selecting, for each unsatisfied check node, a bit-node message with the least magnitude value; and
  (b2) means for selecting, for each unsatisfied check node, the associated bit node associated with the selected bit-node message to be in the first set; and
(v) each unsatisfied check node is associated with one or more bit-node messages; and
  the means for identifying the first set of suspicious bit nodes comprises:
  (b1) means for selecting, for each unsatisfied check node, a check-node message with the greatest magnitude value; and
  (b2) means for selecting, for each unsatisfied check node, the associated bit node associated with the selected check-node message to be in the first set.

24. A method for decoding encoded data using bit nodes and check nodes, the method comprising:
  (a) performing iterative decoding on the encoded data to generate an original near codeword having one or more unsatisfied check nodes, each unsatisfied check node having one or more associated bit nodes, the one or more associated bit nodes for the one or more unsatisfied check nodes forming a set of associated bit nodes;
  (b) selecting, from the set of associated bit nodes, a first set of suspicious bit nodes that may be erroneous bit nodes for the original near codeword;
  (c) adjusting at least one of the suspicious bit nodes in the first set to generate a modified near codeword; and
  (d) performing iterative decoding on the modified near codeword to attempt to generate a decoded correct codeword for the encoded data, wherein step (b) comprises:
    (b1) determining difference values over one or more decoding iterations, wherein each difference value corresponds to a difference between first and second values associated with a common associated bit node;
    (b2) comparing the difference values to a specified threshold; and
    (b3) selecting, as the first set, associated bit nodes with difference values having magnitudes that exceed the specified threshold, wherein at least one of steps (a)-(d) is implemented in a processor.

25. The invention of claim 24, wherein the first and second values are generated during a single decoding iteration.

26. The invention of claim 25, wherein:
  each decoding iteration comprises one or more decoding sub-iterations; and
  the first and second values are generated during a single decoding sub-iteration.

27. The invention of claim 25, wherein:
  at least one decoding iteration comprises two or more decoding sub-iterations; and
  the first and second values are generated during different decoding sub-iterations.

28. The invention of claim 24, wherein the first and second values are generated during different decoding iterations.

29. The invention of claim 24, wherein the first and second values are either two bit-node message values, two check-node message values, or two P values.

30. The invention of claim 24, wherein the first and second values are similar values.

31. The invention of claim 30, wherein the first and second values are specific values.

32. A method for decoding encoded data using bit nodes and check nodes, the method comprising:
  (a) performing iterative decoding on the encoded data to generate an original near codeword having one or more unsatisfied check nodes, each unsatisfied check node having one or more associated bit nodes, the one or more associated bit nodes for the one or more unsatisfied check nodes forming a set of associated bit nodes;
  (b) selecting, from the set of associated bit nodes, a first set of suspicious bit nodes that may be erroneous bit nodes for the original near codeword;
  (c) adjusting at least one of the suspicious bit nodes in the first set to generate a modified near codeword; and
  (d) performing iterative decoding on the modified near codeword to attempt to generate a decoded correct codeword for the encoded data, wherein step (b) comprises:
    (b1) determining whether P values saturate during one or more decoding iterations for different associated bit nodes; and
    (b2) selecting, as the first set, associated bit nodes having a P value that is determined to saturate in step (b1), wherein at least one of steps (a)-(d) is implemented in a processor.

33. A method for decoding encoded data using bit nodes and check nodes, the method comprising:
  (a) performing iterative decoding on the encoded data to generate an original near codeword having one or more unsatisfied check nodes, each unsatisfied check node having one or more associated bit nodes, the one or more associated bit nodes for the one or more unsatisfied check nodes forming a set of associated bit nodes;
  (b) selecting, from the set of associated bit nodes, a first set of suspicious bit nodes that may be erroneous bit nodes for the original near codeword;
  (c) adjusting at least one of the suspicious bit nodes in the first set to generate a modified near codeword; and
  (d) performing iterative decoding on the modified near codeword to attempt to generate a decoded correct codeword for the encoded data, wherein step (b) comprises:
    (b1) determining signs of first and second values after one or more decoding iterations, wherein the first and second values are both associated with either a common associated bit node or a common unsatisfied check node;
    (b2) comparing the signs of the first and second values; and
    (b3) selecting, as the first set, associated bit nodes based on first and second values determined to have opposite sign in step (b2), wherein at least one of steps (a)-(d) is implemented in a processor.

34. The invention of claim 33, wherein the first value is a P value and the second value is an E value.

35. The invention of claim 33, wherein the first value is a P value and the second value is an $L_{ch}$ value.

36. A method for decoding encoded data using bit nodes and check nodes, the method comprising:
  (a) performing iterative decoding on the encoded data to generate an original near codeword having one or more unsatisfied check nodes, each unsatisfied check node having one or more associated bit nodes, the one or more associated bit nodes for the one or more unsatisfied check nodes forming a set of associated bit nodes;
  (b) selecting, from the set of associated bit nodes, a first set of suspicious bit nodes that may be erroneous bit nodes for the original near codeword;
  (c) adjusting at least one of the suspicious bit nodes in the first set to generate a modified near codeword; and (d) performing iterative decoding on the modified near codeword to attempt to generate a decoded correct codeword for the encoded data, wherein:
each unsatisfied check node is associated with one or more bit-node messages; and
step (b) comprises, for each unsatisfied check node:
(b1) selecting a bit-node message with the least magnitude value; and
(b2) selecting the associated bit node associated with the selected bit-node message to be in the first set, wherein at least one of steps (a)-(d) is implemented in a processor.

37. A method for decoding encoded data using bit nodes and check nodes, the method comprising:
(a) performing iterative decoding on the encoded data to generate an original near codeword having one or more unsatisfied check nodes, each unsatisfied check node having one or more associated bit nodes, the one or more associated bit nodes for the one or more unsatisfied check nodes forming a set of associated bit nodes;
(b) selecting, from the set of associated bit nodes, a first set of suspicious bit nodes that may be erroneous bit nodes for the original near codeword;
(c) adjusting at least one of the suspicious bit nodes in the first set to generate a modified near codeword; and
(d) performing iterative decoding on the modified near codeword to attempt to generate a decoded correct codeword for the encoded data, wherein:
each unsatisfied check node is associated with one or more check-node messages; and
step (b) comprises, for each unsatisfied check node:
(b3) selecting a check-node message with the greatest magnitude value; and
(b2) selecting the associated bit node associated with the selected check-node message to be in the first set, wherein at least one of steps (a)-(d) is implemented in a processor.

38. A method for decoding encoded data using bit nodes and check nodes, the method comprising:
(a) performing iterative decoding on the encoded data to generate an original near codeword having one or more unsatisfied check nodes, each unsatisfied check node having one or more associated bit nodes, the one or more associated bit nodes for the one or more unsatisfied check nodes forming a set of associated bit nodes;
(b) selecting, from the set of associated bit nodes, a first set of suspicious bit nodes that may be erroneous bit nodes for the original near codeword;
(c) adjusting at least one of the suspicious bit nodes in the first set to generate a modified near codeword; and
(d) performing iterative decoding on the modified near codeword to attempt to generate a decoded correct codeword for the encoded data, wherein for at least one implementation of step (c), a corresponding modified near codeword for step (d) is generated by adjusting only one suspicious bit node in a near codeword, wherein at least one of steps (a)-(d) is implemented in a processor.

* * * * *

UNITED STATES PATENT AND TRADEMARK OFFICE
CERTIFICATE OF CORRECTION

PATENT NO. : 8,448,039 B2
APPLICATION NO. : 12/401116
DATED : May 21, 2013
INVENTOR(S) : Kiran Gunnam It is certified that error appears in the above-identified patent and that said Letters Patent is hereby corrected as shown below:

In the Claims

In column 24, line 2, replace "(b3)" with --(b1)--

Signed and Sealed this
Thirty-first Day of December, 2013

Margaret A. Focarino
*Commissioner for Patents of the United States Patent and Trademark Office*